United States Patent [19]

Somers et al.

[11] Patent Number: 5,448,948
[45] Date of Patent: Sep. 12, 1995

[54] SQUEEGEE FOR THICK FILM SCREEN PRINTING PROCESSES

[75] Inventors: Jeffery P. Somers, Kokomo; Sherri L. Bernhard; Ronald E. Robison, both of Galveston; Donald E. Eagle, Greentown; Fred E. Richter, Kokomo, all of Ind.; Rudolph J. Bacher, Raleigh, N.C.

[73] Assignee: Delco Electronics Corporation, Kokomo, Ind.

[21] Appl. No.: 279,776

[22] Filed: Jul. 25, 1994

[51] Int. Cl.6 ............................................. B41F 15/42
[52] U.S. Cl. .................................... 101/123; 101/114
[58] Field of Search ............... 101/114, 120, 123, 124, 101/129, 169; 118/413

[56] References Cited

U.S. PATENT DOCUMENTS

| | | | |
|---|---|---|---|
| 3,071,069 | 1/1963 | Sherman | 101/123 |
| 4,665,822 | 5/1987 | Plesinger et al. | 101/123 |
| 4,817,524 | 4/1989 | Riemer | 101/129 |
| 4,989,512 | 2/1991 | Lindström et al. | 101/123 |
| 5,027,703 | 7/1991 | Hancy | 101/123 |

FOREIGN PATENT DOCUMENTS 173692 10/1983 Japan ................................ 101/114

*Primary Examiner*—Edgar S. Burr
*Assistant Examiner*—Stephen R. Funk
*Attorney, Agent, or Firm*—Mark A. Navarre

[57] ABSTRACT

An improved squeegee for screen printing a thick film ink onto a substrate of a microelectronics circuit in order to form a thick film on the substrate. The squeegee is specifically configured to eliminate the creation of voids in a thick film deposited using the squeegee by enhancing the flow characteristics of the thick film ink as it is forced through a printing screen by the squeegee. Improved flow characteristics are achieved be appropriately configuring the cross-sectional profile of the squeegee in order to localize the printing forces on the ink at the working edge of the squeegee, in order to prevent ink ahead of the working edge from prematurely filling the openings in the screen.

1 Claim, 1 Drawing Sheet

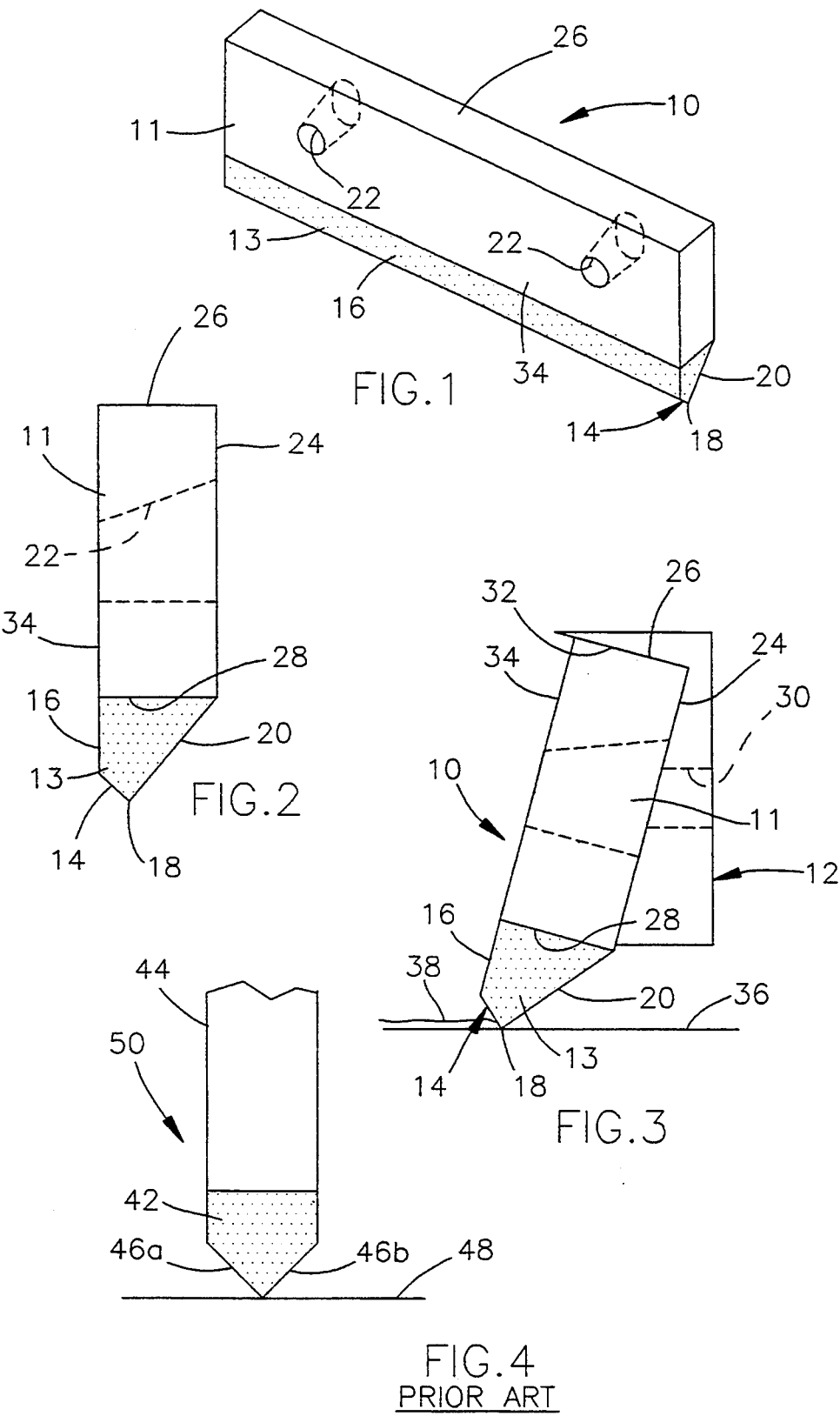

SQUEEGEE FOR THICK FILM SCREEN PRINTING PROCESSES

The present invention generally relates to devices and methods for screen printing a thick film onto a substrate of a microelectronics circuit. More particularly, this invention relates to an improved thick film printing device which is configured to substantially eliminate the presence of voids in a film produced with a thick film screen printing process.

BACKGROUND OF THE INVENTION

As is well known in the art, thick film screen printing techniques are widely practiced for depositing films of various materials in the processing of microelectronics circuits. Often, the film to be deposited is a dielectric composition which is intended to be printed over the substrate and various layers, such as conductors, formed on the substrate. For example, a dielectric film is often employed to isolate one printed conductor runner from an adjacent or subsequently formed conductor runner to prevent shorting between the conductors.

During the screen printing operation, a squeegee is used to force a thick film ink through a screen and onto the substrate, wherein hereinafter substrate will generically refer to the exposed surface of a microelectronics circuit being processed. The screen is typically constructed of stainless steel woven mesh, and has a photolithographically-defined pattern which determines the placement of the ink on the substrate. The inks used in screen printing processes usually are composed of an organic vehicle, glass frit, and active materials such as dielectric materials for insulating films, as noted above, or elemental metals or alloys for conductor films, or semiconductor compounds or alloys for resistor films. The flow characteristics, or rheology, of thick film inks can be generally described as pseudoplastic, in that the shear rate is very low at low stresses, but increases sharply once a sufficient stress is reached. As a result, the squeegee must be appropriately formed and its motion across the screen controlled, in order to maintain a constant angle of contact with the ink so that the force exerted on the ink is constant.

A conventional squeegee 50 known in the prior art is illustrated in FIG. 4. As illustrated, the squeegee 50 includes a base 44 having a blade member 42 affixed to a lower end of the base 44. The blade member 42 is typically molded from neoprene or polyurethane, and has the cross-sectional profile illustrated. Specifically, the blade member 42 generally has a working surface 46a and a trailing surface 46b which have approximately the same surface area, each typically having a width on the order of about 6 millimeters as measured in the direction perpendicular to the edge formed between the surfaces 46a and 46b. In addition, both surfaces 46a and 46b are oriented to be at an angle of about forty-five degrees to the surface of the screen 48, which is suspended above the substrate to be printed. Typical operating speeds for the squeegee 50 illustrated are on the order of about 150 to about 250 millimeters per second.

While squeegees having the configuration of that depicted in FIG. 4 are widely used, pin holes or voids are often formed in the thick film formed by the printing process due to the woven structure of the screen 48 and the flow characteristics of the ink. These voids are highly undesirable because they significantly diminish the electrical characteristics of the thick film, such as the insulating capability of a dielectric thick film layer. Reducing the viscosity of the ink in order to reduce the formation of voids is often not a practical solution to the problem, in that the ink may tend to flow through the screen under the force of gravity alone, and/or the ink may tend to flow on the surface of the substrate, which is unacceptable when precise printing of the thick film is required. While the formation of voids may be reduced by sufficiently slowing the speed of the squeegee 50 as it travels across the screen 48, such a solution is often undesirable because it lowers the through-put of the printing process.

Accordingly, what is needed is an improved squeegee and a method for using such a squeegee, in which the formation of voids is substantially prevented in a thick film deposited by a thick film screen printing process using the squeegee. Preferably, such a squeegee enables desirable through-put levels to be maintained by enabling linear speeds of up to 200 millimeters or more for the squeegee as it travels across the surface of the screen.

SUMMARY OF THE INVENTION

It is an object of this invention to provide a screen printing device for screen printing a thick film ink through a screen so as to form a substantially void-free film on a surface of a microelectronics circuit.

It is a further object of this invention that such a screen printing device entail a squeegee whose cross-sectional profile is tailored to minimize the formation of voids in a film deposited during the screen printing process.

It is another object of this invention that the cross-sectional profile of the squeegee be configured to reduce preloading of the screen ahead of the squeegee during the screen printing process, so as to maximize the flow characteristics of the thick film ink as it is forced through the screen by the squeegee.

It is yet another object of this invention to provide a method for using such a screen printing device, in which the formation of voids within the film are substantially eliminated while maintaining desirable through-put levels.

In accordance with a preferred embodiment of this invention, these and other objects and advantages are accomplished as follows.

According to the present invention, there is provided a screen printing device for screen printing a thick film ink through a screen so as to form a substantially void-free thick film on a surface of a microelectronics circuit. The screen printing device enables a method by which void-free films can be readily deposited at high through-put levels, without necessitating additional procedures or techniques which might otherwise further complicate the printing process. The screen printing device utilizes an improved squeegee configuration whose cross-sectional profile is tailored to reduce preloading of the screen with ink ahead of the squeegee during the screen printing process. In accordance with this invention, it has been determined that, by reducing screen preloading, the formation of voids in films deposited by a thick film screen printing process can be essentially eliminated. More particularly, reduced preloading enhances the flow characteristics of the thick film ink as it is forced through the screen by the squeegee, such that the ink sufficiently flows on the printed surface to eliminate voids, yet will not reduce the precision printing capability of the process.

Generally, the screen printing device of this invention includes a base member having a lower surface facing a screen through which a thick film ink is to be printed onto a surface. Secured to the lower surface of the base member is a blade member, which is formed from a suitably rigid polymeric material, such as polyurethane. The blade member has a cross-sectional profile delineated by a working surface and a trailing surface which intersect to form a working edge of the blade member. During a screen printing operation, the working surface serves to force a thick film ink through the screen at a point of contact between the working edge and the screen, as is conventional. The blade member is secured to the base member such that the working surface is disposed at a contact angle of about fifty-five to about sixty degrees to the screen during the screen printing operation. In addition, the working surface is formed to have a dimension in a direction extending perpendicular to the working edge of 2.0 to about 2.6 millimeters. The trailing surface is formed to have a dimension in a direction extending perpendicular to the working edge of greater than the dimension of the working surface, so as to enhance the rigidity of the blade member.

As a result of the working surface being significantly reduced in size as well as the increased contact angle of the working surface as compared to prior art squeegees, less preloading of the screen with ink occurs ahead of the blade member during the screen printing process. In other words, the tendency is significantly reduced for the working surface to force ink ahead of the blade member to prematurely and unintentionally fill the openings in the screen prior to the arrival of the blade member's working edge. This aspect is important because shear levels in thick film inks are at a maximum when the ink is being forced through the screen by the blade member. In accordance with this invention, it has been determined that thick film ink which has filled the openings in the screen ahead of the blade member will consequently be at a significantly lower shear level at the point of transfer, when the blade member's working edge actually forces the ink through the screen and onto the substrate. Because the viscosity of pseudoplastic materials such as thick film inks is higher at lower shear levels, it was determined that the propensity for voids was increased due to the reduced flow capability of the ink unintentionally preloaded in the screen. Therefore, in accordance with this invention, it has been determined that, by reducing preloading of the screen ahead of the blade member, the formation of voids in thick films deposited by a screen printing process is essentially eliminated. Accordingly, the reduced profile and contact angle of the working surface taught by this invention minimizes the tendency for ink to unintentionally and prematurely fill the openings in the screen in advance of the arrival of the working edge. As such, the blade member is configured to ensure that the ink will have improved flow characteristics during the printing operation, such that voids will not be formed in the resulting thick film. Consequently, the formation of voids can be prevented without resorting to slower printing speeds or other tactics which might complicate or reduce the through-put of the screen printing process.

The screen printing method made possible by the device of this invention generally involves supporting the base member such that the working surface is disposed at an angle of about fifty-five to about sixty degrees to the surface of the screen, and therefore the predetermined direction of travel of the device across the screen. As a conventional manner, a quantity of thick film ink is then placed on the screen which has been accurately positioned over a substrate on which a thick film is to be deposited. The working edge of the printing device is then brought into contact with the screen, and the printing device is moved in its direction of travel so as to print the thick film ink through the screen, thereby forming a substantially void-free film on the substrate.

As can be seen from the above, use of the screen printing device of this invention enables a thick film screen printing process in which void-free thick films can be readily deposited at high through-put levels. Specifically, the improved squeegee configuration of the screen printing device serves to reduce preloading of the screen with ink ahead of the device during the screen printing process, such that the formation of voids in films deposited by the process is essentially eliminated. Because the speed at which the device is moved across the screen need not be reduced in order to prevent the formation of voids, high through-put levels of the process are possible.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which:

FIG. 1 shows, in perspective, a screen printing device in accordance with a preferred embodiment of this invention;

FIG. 2 is an end view of the screen printing device of FIG. 1;

FIG. 3 is an end view of the screen printing device of FIG. 1 as fixtured for use in accordance with a preferred embodiment of this invention; and FIG. 4 is an end view of a screen printing device known in the prior art.

DETAILED DESCRIPTION OF THE INVENTION

Illustrated in FIGS. 1 through 3 is an improved squeegee 10 for screen printing a thick film ink onto a substrate of a microelectronics circuit in order to form a thick film on the substrate. In accordance with this invention, the squeegee 10 is specifically configured to eliminate the creation of voids in a thick film deposited using the squeegee 10 by enhancing the flow characteristics of the thick film ink as it is forced through a printing screen by the squeegee 10. In accordance with this invention, it has been determined that significantly improved flow characteristics are achieved by reducing the tendency for preloading of the screen with ink ahead of the squeegee 10 during the screen printing process. Accordingly, the cross-sectional profile of the squeegee 10 is specifically tailored to localize the printing forces on the ink at the squeegee 10, in order to prevent ink ahead of the squeegee 10 from prematurely filling the openings in the screen prior to the arrival of the squeegee 10.

As shown in FIGS. 1 and 2, the squeegee 10 of this invention generally has an elongated, roughly rectangular shape defined primarily by a base 11 and a blade member 13 secured to a lower surface 28 of the base 11. A preferred geometry is for the base 11 to have a rectangular cross-section, such that its lower surface 28 is approximately parallel to an upper surface 26 of the base 11, and its forward surface 34 is approximately parallel to its rear surface 24. In use, as illustrated in FIG. 3, the squeegee 10 of this invention is supported with a support block 12 and forced across the surface of a printing screen 36 positioned over a surface of a microelectronics circuit (not shown). As is conventional, the squeegee 10 serves to force a quantity of thick film ink 38 located on the upper surface of the screen 36 through openings (not shown) in the screen 36 and onto the surface of the microelectronics circuit. While those skilled in the art will recognize that a preferred size for the squeegee 10 will likely depend on the particular application, the squeegee 10 of this invention has been successfully used having a length of about twelve centimeters, a height of about three centimeters, and a thickness of about one centimeter, with somewhat less than one centimeter of its height being composed of the blade member 13.

In order to provide proper support for the blade member 13, the base 11 is formed from a rigid material, preferably a lightweight metal such as an aluminum alloy, though other suitably rigid materials could be used. The blade member 13 is preferably formed from a material which is sufficiently pliable in order to effectively form a seal against the screen 36 during printing, yet exhibits sufficient rigidity in order to endure the dynamic forces imposed on the squeegee 10 during the printing process. A preferred material is polyurethane having a Shore A hardness of about 55 to about 80, though it is foreseeable that other polymeric materials used to form squeegees, such as neoprene, could be used to form the blade member 13. Generally, the blade member 13 can be molded directly to the base 11 in order to form a suitable bond therebetween, though it is foreseeable that an adhesive could be used for this purpose.

As most readily seen in FIG. 2, the blade member 13 is uniquely shaped to achieve the desired performance capability of the squeegee 10. The profile of the blade member 13 is primarily defined by two intersecting surfaces: a working surface 14 used to force the thick film ink 38 through the screen 36; and a trailing surface 20 which forms a working edge 18 with the working surface 14. As illustrated, the blade member 13 also includes a forward surface 16 which is substantially flush with an adjoining surface 34 of the base 11. With the orientation shown, the working surface 14 is adapted to force the thick film ink 38 through the screen 36 at the point of contact between the working edge 18 and the screen 36. Due to the functional importance of the working surface 14 and the working edge 18, the regions of the blade member 13 which form these features are preferably free of voids, with voids in the remaining regions of the blade member 13 preferably not exceeding about 2.5 millimeters in diameter.

In accordance with this invention, it has been determined that the size and angular orientation of the working surface 14 are critical in order to prevent the formation of voids in a thick film formed by a thick film screen printing process. Specifically, the size and angular orientation of the working surface 14 are carefully selected in order to reduce preloading of the openings in the screen 36 with ink 38 during the screen printing process. In other words, the size and angular orientation of the working surface 14 are such that the tendency is substantially reduced for the thick film ink 38 ahead of the working edge 18 of the blade member 13 to prematurely fill the openings in the screen 36 prior to being encountered by the working edge 18. In order to prevent the formation of voids in a screen printed thick film, the flow characteristics of the thick film ink 38 through the screen 36 must be appropriately optimized. In accordance with this invention, it has been determined that, as the blade member 13 encounters a quantity of ink 38 deposited on the screen 36, any ink already disposed within the openings in the screen 36 will be at a lower shear level than ink remaining on the upper surface of the screen 36. Because the viscosity of pseudoplastic materials such as thick film inks is higher at lower shear levels, it was determined that the propensity for voids was increased due to the reduced flow capability of the ink preloaded in the openings in the screen 36. Therefore, in accordance with this invention, it has been determined that, by reducing the tendency for the ink 38 to preload or prefill the openings in the screen 36 ahead of the working edge 18 of the blade member 13, the formation of voids in thick films deposited by the screen printing process was essentially eliminated.

Notably, during the investigation which culminated in the squeegee 10 of this invention, it was also determined that the tendency for voids to occur in a thick film was also significantly dependent on the amount of thick film ink placed on the screen and the speed at which a squeegee was moved across the surface of the screen. A screen fully loaded with a thick film ink was found to produce the greatest number of voids in the resulting thick film. Also, under some conditions, the tendency for voids could be reduced by decreasing the speed at which the squeegee traveled across the screen. However, in order to suitably reduce the formation of voids, either an undesirably high degree of control was required to limit the amount of thick film ink deposited on the screen, or the speed at which the squeegee was required to move was on the order of about 100 millimeters per second or less, which is generally inadequate to achieve desired through-put levels for typical production standards. Importantly, it was determined that higher amounts of thick film ink on a screen was associated with a greater tendency for preloading the screen ahead of the squeegee.

Therefore, the solution taught by this invention involves uniquely configuring the working surface 14 of the blade member 13 to have a reduced profile and contact angle, in order to reduce the tendency for preloading ink ahead of the working edge 18 of the blade member 13. Accordingly, one key aspect of the present invention is to reduce the height, or profile, of the working surface 14 as compared to prior art squeegees, such as that shown in FIG. 4. In accordance with this invention, a preferred dimension for the working surface 14 in a direction perpendicular to the working edge 18, that is, the dimension of working surface 14 depicted in the cross-sectional views of FIGS. 2-3, is about 2.0 to about 2.6 millimeters, and more preferably about 2.3 millimeters, though it is foreseeable that this dimension might be increased or decreased to complement a particular printing operation. Another key aspect of this invention is the angular orientation, or contact angle, of the working surface 14. As shown in FIG. 3, a preferred angle for the working surface 14 relative to the screen 36 is about fifty-five to about sixty degrees. This angular range is preferably achieved by disposing the entire squeegee 10 with the support block 12 at an angle of about ten to about fifteen degrees from normal to the screen 36. Therefore, assuming the rectangular cross-section of the base 11 shown in the figures, the working surface 14 is preferably disposed at an angle of about forty-five degrees to the lower surface 28 of the base 11. Another important aspect of this invention is that, due to the reduced working surface 14, sufficient rigidity of the blade member 13 be maintained. Consequently, the trailing surface 20 is preferably disposed at an angle of about ninety degrees to the working surface 14 and an angle of about forty-five degrees to the lower surface 28 of the base 11. In addition, the trailing surface 20 is configured to have a dimension in a direction extending perpendicular to the working edge 18, that is, the dimension of trailing surface 20 depicted in the cross-sectional views of FIGS. 2-3, of greater than the corresponding dimension of the working surface 14, so as to achieve the profile of the blade member 13 shown in FIGS. 1 through 3.

As noted above, FIG. 3 illustrates the usage of the squeegee 10 as contemplated by this invention. The upper surface 26 of the base 11 is abutted against an upper interior surface 32 of the support block 12, while the rear surface 24 of the base 11 is abutted against a lower interior surface of the support block 12. The upper interior surface 32 is disposed at an angle of about ten to about fifteen degrees to the surface of the screen 36 in order to appropriately orient the squeegee 10 to the surface of the screen 36, as noted above, though this angle would obviously differ if the upper surface 26 of the base 11 were not parallel to the lower surface 28 of the base 11. The base 11 is secured to the support block 12 with any suitable fastener (not shown) by employing the paired apertures 22 and 30 formed in the base 11 and support block 12, respectively. While the above construction is preferred, it is entirely foreseeable that the base 11 and the support block 12 could be formed as a unitary member, and that this unitary member could be formed with a lower surface which is parallel to the surface of the screen 36, necessitating that the cross-section of the blade member 13 be altered to achieve the contact angle and profile described above for the working surface 14.

In a thick film screen printing operation, the squeegee 10 of this invention is used in a substantially conventional manner, with the fundamental exception being that a substantially void-free thick film results. A known example for such a printing operation is the printing of a dielectric thick film ink over a broadside conductor line of a microelectronics circuit to form a dielectric layer whose thickness is generally on the order of about twenty-five micrometers. In such a process, the squeegee 10 of this invention is fixtured with the support block 12 as shown in FIG. 3, such that the working surface 14 faces the direction of travel of the squeegee 10 as it travels across the surface of the screen 36. As such, the working surface 14 will act to force the thick film ink 38 through the screen 36 at the point of contact between the working edge 18 and the screen 36. The base 11 is supported by the support block 12 such that its lower surface 28 is disposed at an angle of about ten to about fifteen degrees to the direction of travel of the squeegee 10 and, more importantly, the working surface 14 is disposed at an angle of about fifty-five to about sixty degrees to the direction of travel of the squeegee 10 and the surface of the screen 36. A quantity of thick film ink 38 is then deposited on the screen 36, which is typically supported above the substrate on which the thick film is to be formed, and the working edge 18 is brought into contact with the screen 36. The squeegee 10 is then moved across the screen 36 so as to print the thick film ink 38 through the screen 36 and form a substantially void-free film on the underlying substrate. As the squeegee 10 moves across the surface of the screen 36, greater shear of the thick film ink 38, corresponding to a lower viscosity for the ink 38, is localized at the point of transfer of the ink 38 through the screen 36. In accordance with this invention, printing speeds of up to about 200 millimeters per second, and potentially higher speeds, can be achieved without the formation of voids due to the unique cross-sectional profile of the blade member 13.

To illustrate the above, the squeegee 10 of this invention was compared to the prior art squeegee 50 illustrated in FIG. 4. In addition, the orientation of the squeegee 10 to the screen 36 and the profile of the working surface 14 were also varied to determine their effects on the ability to print void-free thick films. Design A identifies the squeegee 50 of the prior art, while Design B identifies the squeegee 10 of this invention. The conditions for the investigation were as reported in Table I, with "Orientation" referring to the orientation of the longitudinal axis of the squeegees 10 and 50 relative to the squeegees' direction of travel across the screen, and the orientation of the working surfaces 14 and 46a of the squeegees 10 and 50, respectively, relative to the plane of the screen. "Height" refers to the dimension of the working surfaces 46a and 14 in a direction extending perpendicular to their respective working edges (e.g., the working edge 18 of the squeegee 10). The investigation involved printing a dielectric thick film ink onto a broadside conductor line through a screen having a mesh count of 290 per inch to form a dielectric thick film having a thickness on the order of about twenty-five micrometers.

TABLE I

| Design/ | Orientation (degrees): | | Height | Speed |
| Trial No. | Squeegee | Working Surface | (mm) | (mm/s) |
| --- | --- | --- | --- | --- |
| A/1 | 90 | 45 | 6.7 | 200 |
| A/2 | 100 | 55 | 6.7 | 200 |
| B/1 | 90 | 45 | 1.5 | 200 |
| B/2 | 90 | 45 | 2.3 | 300 |
| B/3 | 100 | 55 | 2.3 | 200 |
| B/4 | 103 | 58 | 2.3 | 200 |

Note:
The orientation employed in the A/1 trial is represented in FIG. 4 of the drawings, while the orientations employed for the B/3 and B/4 trials are generally represented by FIG. 3.

In each of the trials using the prior art squeegee 50, Design A, voids were present in the resulting dielectric thick film, though fewer voids were produced by the A/2 squeegee than by the A/1 squeegee. The results using the Design B squeegee of this invention were as follows: Much fewer voids resulted with the use of the B/1 squeegee as compared to the A/1 squeegee; The B/2 squeegee also performed much better than the A/1 squeegee, but produced slightly more voids than the A/2 squeegee; Both the B/3 and B/4 squeegees did not produce any voids, and therefore were superior to any of the other squeegees tested. The above data illustrates that, in accordance with this invention, the relationship between the orientation (contact angle) of the working surface 14 to the plane of the screen and the height of the working surface 14, as measured in a direction extending perpendicular to the working edge 18, is extremely important for producing a void-free thick film.

From the above, it can be seen that a significant advantage of the present invention is that the squeegee 10 enables a thick film screen printing process in which void-free thick films can be readily deposited at high through-put levels. The improved blade member 13 of the squeegee 10 serves to reduce preloading of the screen 36 with ink 38 ahead of the squeegee 10 during the screen printing process, such that the formation of voids in thick films deposited by the process is essentially eliminated. Because the speed at which the squeegee 10 can be moved across the screen 36 need not be reduced, desirable through-put of the process can be achieved. In addition, it is believed that the process capability of the squeegee 10 of this invention is applicable to various thick film screen printing applications, with only minor modifications being potentially necessary to the cross-sectional profile of the blade member 13.

Therefore, while our invention has been described in terms of a preferred embodiment, it is apparent that other forms could be adopted by one skilled in the art; for example, by forming the blade member to have a cross-sectional profile which differs slightly from that described in the text and illustrated in the figures, or by altering the shape or construction of the base 11 and the support block 12, or by substituting appropriate materials. Accordingly, the scope of our invention is to be limited only by the following claims.

The embodiments of the invention in which an exclusive property or privilege is claimed are defined as follows:

1. An improved printing device for printing a thick film ink through a screen so as to form a substantially void-free thick film on a substrate underlying said screen, said printing device including a squeegee having a longitudinal axis terminating in a polymeric tip having a cross-sectional profile delineated by a working surface and a trailing surface which intersect to form a working edge of said tip, and a support member holding the squeegee so that the working edge is maintained in registry with the screen, the support member being adapted to move the squeegee in a direction parallel to the screen to force thick film ink through the screen at a point of contact between the working edge and the screen, the improvement wherein:

the longitudinal axis of the squeegee is inclined away from the squeegee's direction of movement by an angle of about ten to fifteen degrees;

the working surface of the squeegee is inclined toward the squeegee's direction of movement, forming an angle of about fifty-five to sixty degrees between the screen and the working surface;

the working surface of the tip has a dimension extending perpendicular to the working edge of about 2.0 to 2.6 millimeters;

the trailing surface is disposed at an angle of about 90 degrees with respect to the working surface; and the trailing surface has a dimension extending perpendicular to the working edge which is greater than the working surface dimension.

* * * * *